(12) United States Patent
Patrice

(10) Patent No.: US 8,317,108 B2
(45) Date of Patent: Nov. 27, 2012

(54) CHIP CARD WITH DUAL COMMUNICATION INTERFACE

(75) Inventor: Philippe Patrice, Marseilles (FR)

(73) Assignee: Smart Packaging Solutions (SPS), Rousset (FR)

( * ) Notice: Subject to any disclaimer, the term of this patent is extended or adjusted under 35 U.S.C. 154(b) by 165 days.

(21) Appl. No.: 12/593,570

(22) PCT Filed: Mar. 28, 2008

(86) PCT No.: PCT/FR2008/000435
§ 371 (c)(1),
(2), (4) Date: Apr. 2, 2010

(87) PCT Pub. No.: WO2008/142245
PCT Pub. Date: Nov. 27, 2008

(65) Prior Publication Data
US 2010/0176205 A1    Jul. 15, 2010

(30) Foreign Application Priority Data
Mar. 29, 2007    (FR) ...................................... 07 02299

(51) Int. Cl.
*G06K 19/06*    (2006.01)
(52) U.S. Cl. .......................... 235/492; 235/380; 235/451
(58) Field of Classification Search .................. 235/492, 235/380, 487, 451, 375
See application file for complete search history.

(56) References Cited

U.S. PATENT DOCUMENTS

| | | | | |
|---|---|---|---|---|
| 5,598,032 | A * | 1/1997 | Fidalgo | 257/679 |
| 5,671,525 | A * | 9/1997 | Fidalgo | 29/600 |
| 6,422,473 | B1 * | 7/2002 | Ikefuji et al. | 235/492 |
| 7,198,199 | B2 * | 4/2007 | Ho | 235/492 |
| 7,546,671 | B2 * | 6/2009 | Finn | 29/592.1 |
| 8,030,746 | B2 * | 10/2011 | Tan | 257/686 |
| 2008/0245879 | A1 | 10/2008 | Artigue et al. | |

FOREIGN PATENT DOCUMENTS

| | | |
|---|---|---|
| EP | 1 031 939 A1 | 8/2000 |
| EP | 1 437 684 A1 | 7/2004 |
| FR | 2 823 888 A1 | 10/2002 |
| FR | 2 890 212 A1 | 3/2007 |
| WO | WO 2004/027863 A2 | 4/2004 |

OTHER PUBLICATIONS

International Search Report (PCT/ISA/210) for PCT/FR2008/000435 mailed Nov. 28, 2008.

* cited by examiner

*Primary Examiner* — Edwyn Labaze
(74) *Attorney, Agent, or Firm* — Buchanan Ingersoll & Rooney PC

(57) ABSTRACT

The invention relates to a chip card with a dual contact and contactless communication interface, including a microelectronic module (11) and a card body (22) provided with a cavity (23) which can receive the microelectronic module, said microelectronic module (11) being formed by a substrate (15), the first face thereof bearing a terminal block of electric contacts (4) and a second face thereof bearing a first microelectronic chip (9) electrically connected to the terminal block of electric contacts (4) and a second chip (10) electrically connected to the terminals of an antenna (13), the coils of which are disposed on the second face of the substrate of the electronic module. The invention is characterised in that the card body (22) includes a device (18) for concentrating and/or amplifying electromagnetic waves, which can channel the electromagnetic flow received, in particular, from a contactless chip card reader toward the coils of the antenna (13) of the microelectronic module (11).

9 Claims, 3 Drawing Sheets

CHIP CARD WITH DUAL COMMUNICATION INTERFACE

The invention relates to a chip card with a dual contact and contactless communication interface, said card comprising a microelectronic module and a card body provided with a cavity which can receive the microelectronic module, said microelectronic module being formed by a substrate, the first face thereof bearing a terminal block of electric contacts and a second face thereof bearing a first microelectronic chip electrically connected to the terminal block of electric contacts and a second chip electrically connected to the terminals of an antenna, the coils of which are disposed on the second face of the substrate of the electronic module.

Chip cards with mixed operation that are able to communicate both in contact mode and contactless mode, with a chip card reader already exist in the prior art. The majority of said known chip cards have a microelectronic module provided with contacts, said module comprising on one hand a chip, the operation mode of which is with contact only, and on the other hand an electronic assembly located in the card body and consisting of a chip, the operation mode of which is contactless only, said contactless chip being connected to an antenna itself also disposed on the card body.

Said card type is more commonly known as a hybrid card, and in such a card, the software applications that are executed in the contact chip are generally separate from those that are executed in the contactless chip, with the difference of so-called dual or combined communication interface cards, wherein the contact communication interface and the contactless communication interface both have access to a one and same chip.

Among all of the dual communication interface cards, the hybrid type cards known in current state of the art comprise on one hand a contact electronic module, which carries a first chip intended for the contact operation mode, which is connected to a connection terminal block with contacts enabling a contact chip card reader to be placed in relation with similar contacts. Said known hybrid cards comprise on one hand a plastic card, known as an inlay, and which in turn carries an antenna connected to a second microelectronic chip intended for the contactless operation mode by radio frequency communication with a contactless chip card reader.

In said first type of known hybrid cards, the structure of the contactless inlay therefore co-exists with the structure of the contact microelectronic module, the two being incorporated in a superimposed manner in the thickness of the body of the chip card.

Said structure generally procures a good range with the contactless communication interface, given the large size of the antenna, but it poses a series of problems for producing the card in its entirety.

Indeed, said hybrid cards of the first type are generally manufactured according to the following steps:
- manufacturing of an inlay consisting of layers of plastic materials inside of which is found a chip connected to an antenna. Said antennas may be manufactured using the well-known methods using incrusted copper wires, or the conductive ink printing or the etching of copper coils of the antenna on the internal material of the card body.
- manufacturing of the electronic micromodule comprising the chip connected to the terminal block of electric contacts.
- machining in the card body of the cavity enabling housing of the electronic module.
- bonding of the electronic micromodule.

Said methods for manufacturing said type of cards currently pose a certain number of problems, including the need to manufacture card bodies, the two faces of which are printed and which may also comprise physical security mechanisms such as so-called UV inks, that are sensitive to ultraviolet rays, in particular in the case of cards dedicated to identity control applications. Given said printing steps, which are delicate, the methods for manufacturing card bodies produce fairly low manufacturing efficiency.

In addition, the printing is carried out on already assembled cards which already comprise onboard all of the electronics, i.e. the contact electronic module and the inlay carrying the contactless chip and the antenna thereof, a printing fault of a card also results in the loss of the two chips, which are the most expensive components of the card. It can therefore be seen that the cost of hybrid cards manufactured according to said method is relatively high, given the relatively low efficiency of the printing steps.

In addition to the hazards related to the printing of the card body, the methodologies used to produce said card bodies are based on the application of high pressures and high temperatures, which makes the contactless chip and the antenna thereof fragile and is likely to significantly reduce the service life of the card. This constitutes a major obstacle for identity type cards the required service life of which is between 5 and 10 years.

The result of the above mentioned is that said first type of hybrid cards cannot be guaranteed over a very long period of use (greater than 5 years for example), which limits the applications available for said type of cards.

To mitigate said manufacturing problems, a second type of hybrid card has been thought of, wherein the contactless chip is integrated directly into the microelectronic module which is provided with contacts and which carries the dedicated chip to the contact operation. For this, said module must be provided with a radio frequency communication interface intended for being connected to the terminals of an antenna which is itself produced in the card body.

Thus, the hybrid cards that comply with said second known type comprise:
- an electronic module comprising two chips, the terminal block of contact connections, and two contacts located in the rear face, connected to the contactless chip and enabling the following to be connected to the antenna;
- a plastic card, comprising an antenna;
- and an electrically conductive material enabling the connection between the electronic module and the antenna.

Said structure itself also generally procures a good range given the large size of the antenna, but it poses another series of production problems, related to the existence of the mechanical and electrical connection between the antenna and the module, the production of which again induces losses of reliability or reductions in manufacturing efficiency.

Indeed, said hybrid cards of the above described second type are generally manufactured according to the following steps:
- manufacturing of the card body comprising an antenna. Said antennas may be manufactured using the known methods implementing incrusted copper wires, or the conductive ink printing or the etching of copper on the internal material of the card body.
- manufacturing of the electronic micromodule comprising the two chips and comprising connection points for the antenna, on the opposite face to the one which carries the electric contacts of the micromodule.

machining in the card body of the cavity enabling housing of the electronic module, while exposing the connection ranges of the antenna located inside the card body.

bonding of the electronic micromodule by establishing the electrical connection between the latter and the exposed connection ranges of the antenna. Said connection may be obtained by known methods, such as the dispensing of conductive glue that will then be polymerised, the use of adhesive or conductive pastes anisotropically (in thickness), or the use of a polymer spring deposited on the module (in the form of a compressible and projecting conductive stud).

Said methods for manufacturing said second type of hybrid cards currently pose the following problems:

need to manufacture specific card bodies, comprising an antenna and therefore inducing complex manufacturing methods, which reduces manufacturing efficiency as explained above.

need to machine the card bodies exposing the ranges of the antenna, which also reduces manufacturing efficiency.

use of a method for bonding the electronic module in the specific card enabling an electrical interconnection of the module and the antenna.

Finally, said methods are often very slow in comparison with the methods generally used for the standard chip cards that are contact operation cards, and they induce additional losses in manufacturing efficiency.

Furthermore, the methods of interconnection between module and antenna used in said second type of hybrid card greatly limit the reliability of the final card. Indeed, the thermal and mechanical stresses applied to the card during the use thereof, result in connection breaks between the module and the antenna, or significant increases in the resistance of said connection, resulting in a loss of performance of the card during use.

One aim of the invention is consequently to propose a hybrid type, electronic chip card with a dual contact and contactless communication interface, which does not have the above mentioned disadvantages.

Another aim of the invention is to propose a chip card having a very high reliability and great longevity, around five to ten years.

To this end, the invention provides a dual contact and contactless communication interface, comprising a microelectronic module and a card body provided with a cavity which can receive the microelectronic module, said microelectronic module being formed by a substrate, the first face thereof bearing a terminal block of electric contacts and a second face thereof bearing a first microelectronic chip electrically connected to said terminal block of electric contacts and a second chip electrically connected to the terminals of an antenna, the coils of which are disposed on the second face of the substrate of the electronic module, characterised in that the card body comprises a device for concentrating and/or amplifying electromagnetic waves, which can channel the electromagnetic flow received from a contactless chip card reader toward the coils of the antenna of the microelectronic module. Said structure will enable the performances of the final card to be improved, and the manufacturing efficiency to be increased. It should indeed be noted that in said configuration, no electrical interconnection between the electronic module and said amplifying device should be carried out, which enables all of the advantages relating to the reliability of the methods used for bonding the module to be retained for the contact cards. Furthermore, by means of said structure and of said method, a good module (tested as such) is inserted into a good card, without the step for bonding the module, well controlled in itself, being likely to substantially jeopardise manufacturing efficiency, which therefore has a gain of approximately 1,015% in relation to known methods, with a similar gain as regards the manufacturing cost. Whereas in the method according to the prior art, if the connection test of the module proves to be poor, two good chips will have been lost during said manufacturing step.

Preferably, said device for concentrating and/or amplifying electromagnetic waves is a (R,L,C) circuit type of circuit, which can enter into resonance with the antenna disposed on the module, which enables the electromagnetic flow passing through the antenna of the module to be increased by mutual inductance, as known in itself. Consequently, this also enables, all things being equal, the range of communication of the hybrid card to be increased when it is operating in contactless mode.

In an alternative very simple embodiment of the R,L,C circuit, said device for concentrating and/or amplifying electromagnetic waves consists of a metal sheet disposed in the card body below the cavity receiving the microelectronic module. The person skilled in the art will have no trouble in dimensioning said metal sheet according to the required performances.

According to another alternative embodiment, the device for concentrating and/or amplifying electromagnetic waves consists of an antenna comprising at least one coil, disposed in the card body below the cavity intended for receiving the microelectronic module.

Advantageously, the coils of the antenna of the module are located on the periphery of the module, and the electric contacts of the terminal block are located inside the area defined by the coils of the antenna. Thus, the electromagnetic flow captured by the coils of the antenna of the module is maximum, which favourably influences the range of the contactless communication with the reader. In this embodiment, the electric contacts of the terminal block of contacts are preferably arranged in order to comply with ISO standard 7816-2.

However, the reverse embodiment of the invention is possible; the electric contacts of the terminal block are therefore located on the periphery of the module, and the coils of the antenna of the module are located inside the area defined by the contacts.

Advantageously, the coils of the antenna of the module are located on the same side of the substrate as the microelectronic chip, and the electric contacts of the terminal block are located on the opposite face of the substrate.

Other features and advantages of the invention will emerge from reading the detailed description and appended drawings wherein.

Figure 1A:
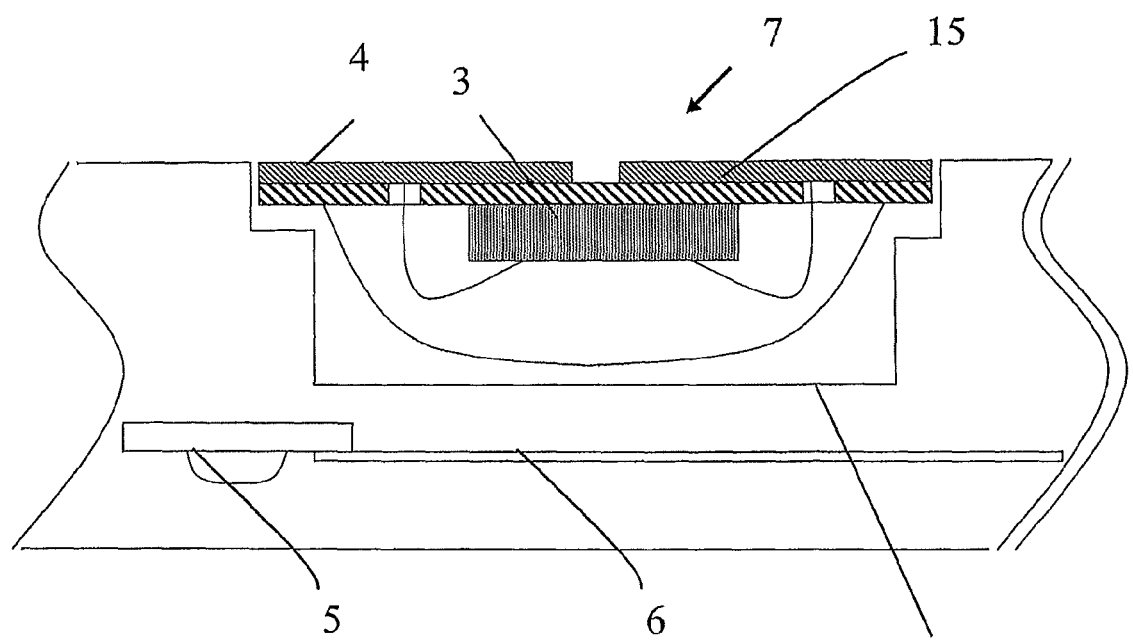
FIG. 1A illustrates a cross-sectional view of a first type of hybrid card in accordance with the prior art.

As indicated above, FIG. 1A shows an electronic card with a dual contact and contactless communication interface, in accordance with the prior art. A module 7 can be clearly seen including a first chip 3 which is connected to a terminal block of electric contacts 4 to provide the operation in contact mode with a contact reader. The module 7 also comprises a second chip 5 connected to an antenna 6 located in a card body, the assembly formed by the second chip 5 and the antenna 6 being intended for providing a radio frequency communication with a contactless chip card reader, not shown. Therefore, there are two distinct and separate assemblies distributed in the chip card, i.e. one assembly with contact operation disposed on the microelectronic module 7, and one assembly with contactless operation disposed in the card body, with the previously mentioned disadvantages at the level of the manufacturing method.

Figure 1B:
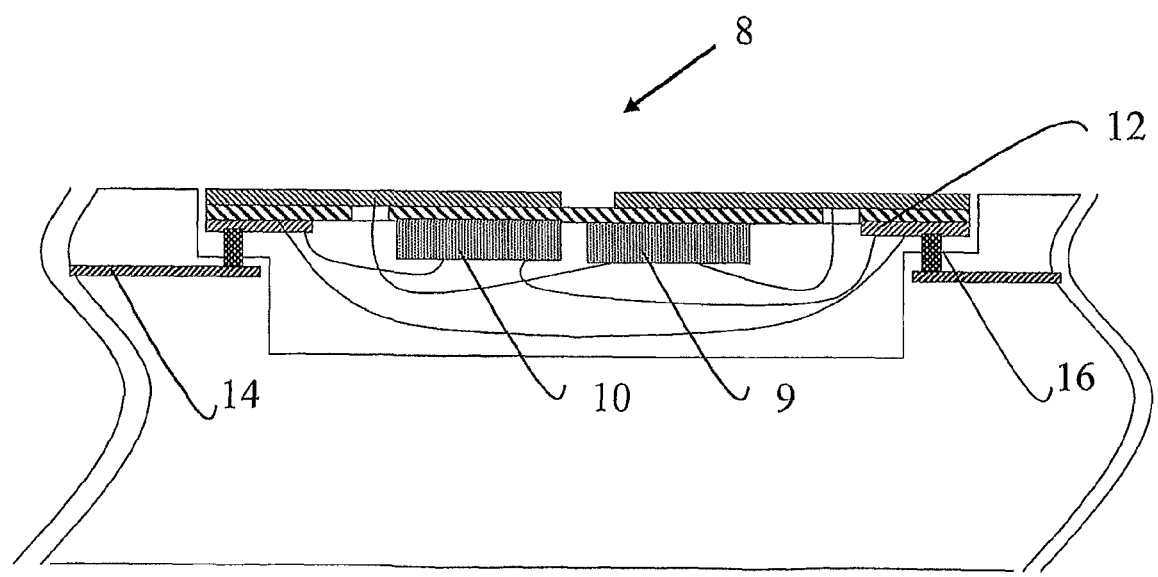
FIG. 1B illustrates a cross-sectional view of another hybrid card configuration in accordance with the prior art.

Reference is now made to FIG. 1B to which shows another dual communication interface card solution, in accordance with the prior art.

On said figure a module 8 is found comprising a first chip 9 connected to the terminal block of electric contacts 4 and a second chip 10 connected to the contact ranges 12 dedicated to being interconnected to an antenna 14 located in a card body.

The electrical connection between the antenna 14 and the contact ranges 12 is produced by means of studs 16 produced in an electrically conductive material. As explained above, the manufacturing of said card comprises an efficiency negatively affected in particular by the fragility of the connection 16.

Figure 2:
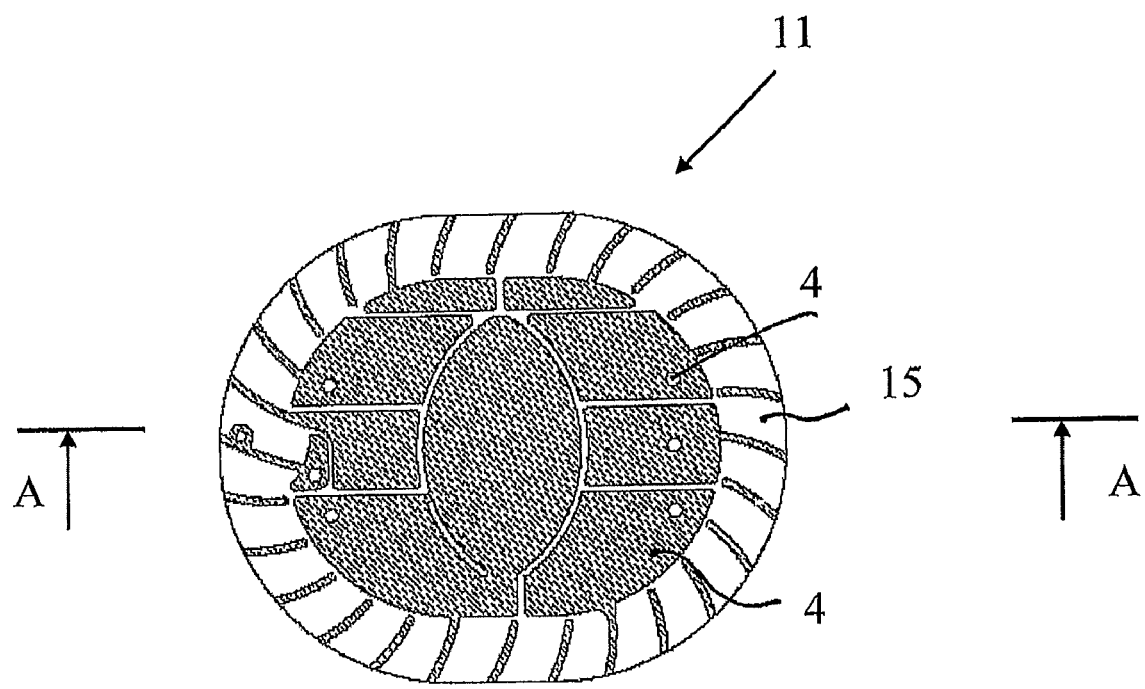
FIG. 2 illustrates a top view of an electronic module in accordance with the invention.
Figure 3:
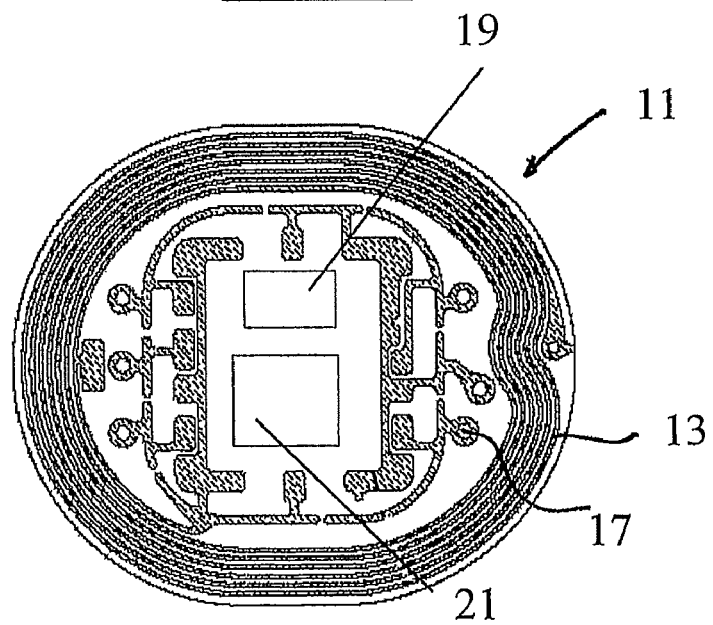
FIG. 3 illustrates a view from below of the module from FIG. 2.

Reference is now made to FIGS. 2 and 3. In these figures an electronic module 11 is shown in accordance with the invention, in top view (FIG. 2), i.e. a view from the side of the contacts, and in view from below (FIG. 3), i.e. here a view from the side of the substrate not carrying the electric contacts.

To remedy the problems of electromagnetic interference between the contacts and the antenna as previously described, the coils 13 of the antenna are attached to the periphery of the module, in an area where they are located neither below nor above the electric contacts 17, but substantially outside of the area defined by the contacts. The wells or vias 17 that make it possible to electrically connect the contacts of the contact chip 9 to the corresponding contacts 4 of the terminal block of the module 11 are also shown. The locations reserved for the bonding of the two chips are denoted 19,20 in FIG. 3.

Said module structure has the advantage of minimising or even eliminating the effects of electromagnetic shielding of the contacts 4 with regard to the coils 13 of the antenna.

Figure 4:
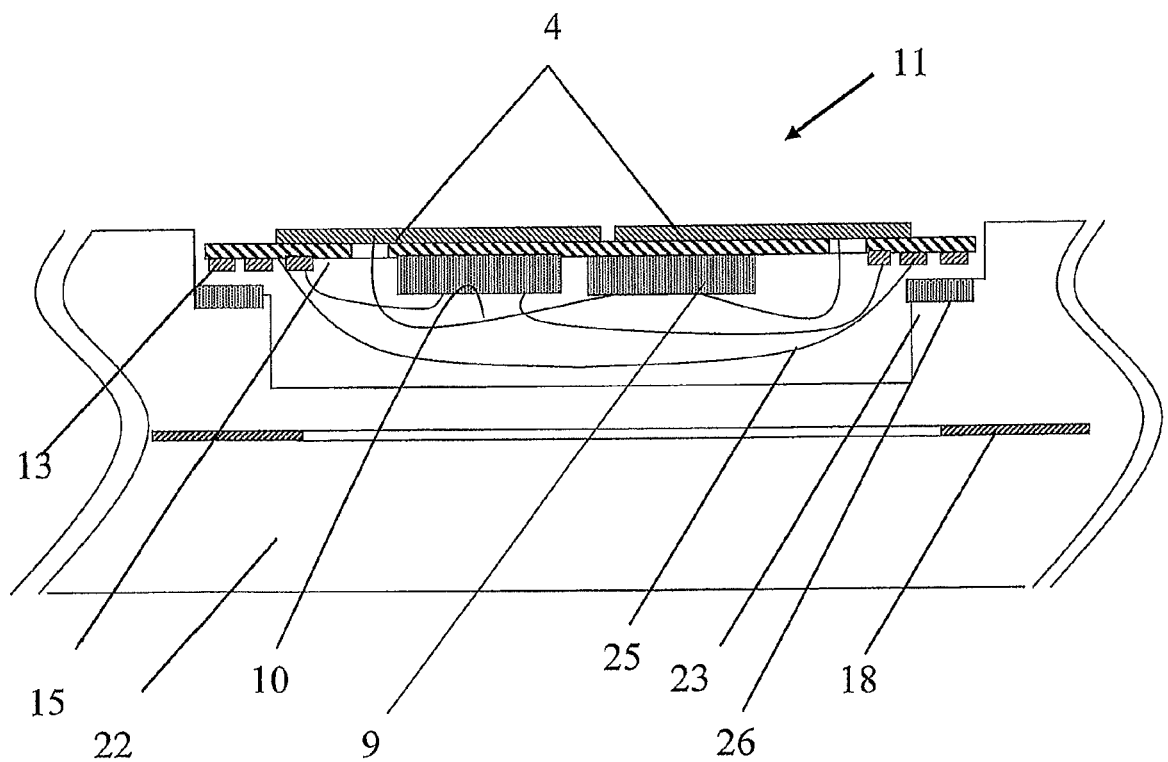
FIG. 4 illustrates a cross-sectional view of the module from FIGS. 3 and 4 in accordance with the invention.

Reference is made to FIG. 4 which shows in A-A cross-section of FIG. 2, the structure of the chip card according to the invention. The module 11 has been shown in this figure with the substrate 15 thereof, carrying the first chip 9 dedicated to the contact operation, and which is therefore connected to the terminal block of electrical connections 4. The module 11 also carries the second chip 10, which is connected to the antenna 13 of the module and which is consequently dedicated to the contactless operation.

The two chips are enclosed in a drop of coating resin 25. The antenna 13 is located at the periphery of the module 11, next to the chips and the coating resin 25 and extends around the chips 9 and 10.

The card according to the invention further comprises a card body 22 provided with a device for concentrating or amplifying 18 electromagnetic waves, in particular, of the R,L,C, circuit type, which can channel the electromagnetic flow toward the coils of the antenna of said module. The concentration device 18 is located on all or part of the card body. Said device 18, which can in particular consist of a simple metal sheet, has R,L,C features that can channel the electromagnetic field coming from a contactless reader and received by the chip card, toward the antenna 13 of the module, so as to substantially improve the quality of the operation and the range of the chip card in contactless mode.

In the simplest embodiment thereof, the device 18 for concentrating and/or amplifying electromagnetic waves consists of a metal sheet disposed in the card body 22 below the cavity 23 receiving the microelectronic module 11.

In another advantageous embodiment, the device 18 for concentrating and/or amplifying electromagnetic waves consists of an antenna consisting of at least one coil, disposed in the card body 22 below the cavity 23 receiving the microelectronic module 11.

The electric contacts 4 of the terminal block are located on one face of the substrate 15 of the module, and the coils of the antenna 13 of the microelectronic module are located on the opposite face of the substrate.

Preferably, the coils of the antenna 13 of the microelectronic module are located on the periphery of the module 11, and the electric contacts 4 of the terminal block are substantially located inside the area defined by the coils of the antenna of the module. In this way, the electric contacts 4 do not disturb the electromagnetic flow intended for the antenna 13.

In order to manufacture the concentration or amplification device 18 in the card body 22, one of the techniques already known in itself is used, such as the insertion of a ring-shaped metal sheet, or the insertion of a coiled antenna, into the card body, in the position shown in FIG. 4. According to the compatibility of the material of the card body, an antenna 18 may also be obtained by deposit of a metal layer on an internal face of the card body or of an inlay of the card body, followed by an etching step for defining the coils of the antenna 18.

When the chip card is assembled according to the invention, the module 11 is attached opposite a cavity 23 arranged in the card body 22. The cavity 23 is provided with an area coated with an adhesive 26. The module 11, after having been tested to establish the correct operation thereof is attached in the cavity as shown, the coils of the antenna 13 of the modules coming into contact with the adhesive 26. There then follows a step for pressing on the top face of the module 11, to ensure good quality bonding of the module 11 in the cavity 23.

Finally, the invention proposes a particular design enabling optimum operation of the module designed such as to allow the electromagnetic flow to pass inside the antenna 13 of the module without being disturbed by the metallisations of the contacts, which enables the antenna to react to said flow, in order to supply sufficient energy for the radio frequency communication of the chip. Said flow is reinforced by means of the concentration and/or amplification device 18, which enables the magnetic flow received by the antenna 13 of the module to be optimised, while contributing to the manufacturing simplicity thereof, for producing a hybrid chip card with a long service life.

It is indeed fundamental to note that by means of the invention, the electronic module requires no electrical connection with the card body, and standard inserting methods for contact cards may therefore be used, which results in a gain in manufacturing rate and an increase in manufacturing efficiency and reliability. This makes it possible to apply this technology to very severe, or very long, terrain applications, such as for example the application to identity cards or electronic passports, for which government offices generally require a guarantee of good resistance and good operation for ten years.

By means of a single insertion of an optimised hybrid module into a card body simply provided with a passive R,L,C component enabling the performances of the card in contactless mode to be very substantially improved, a hybrid card is obtained with lower costs and better manufacturing efficiency in comparison with known hybrid cards.

The invention claimed is:

1. A chip card with a dual contact and contactless communication interface, comprising:

a microelectronic module and a card body provided with a cavity which can receive the microelectronic module, said microelectronic module being formed by a substrate having a first face bearing a terminal block of electric contacts and a second face bearing a first microelectronic chip electrically connected to said terminal block of electric contacts, and a second chip electrically connected to the terminals of an antenna, said antenna having coils which are disposed on the second face of the substrate of the electronic module, and said card body comprising a device for concentrating and/or amplifying electromagnetic waves, which can channel the electromagnetic flow received from a contactless chip card reader toward the coils of the antenna of the microelectronic module.

2. A chip card according to claim 1, wherein said device for concentrating and/or amplifying electromagnetic waves is a (R,L,C) circuit.

3. A chip card according to claim 2, wherein said device for concentrating and/or amplifying electromagnetic waves comprises a metal sheet disposed in the card body below the cavity receiving the microelectronic module.

4. A chip card according to claim 2, wherein said device for concentrating and/or amplifying electromagnetic waves comprises an antenna having at least one coil, disposed in the card body below the cavity receiving the microelectronic module.

5. A chip card according to claim 4, wherein the coils of the antenna of the microelectronic module are located on the periphery of the module, and the electric contacts of the terminal block are located inside the area defined by the coils of the antenna of the module.

6. A chip card according to claim 1, wherein the electric contacts of the terminal block are located on a face of the substrate, and the coils of the antenna of the microelectronic module are located on the opposite face.

7. A method for manufacturing a hybrid type chip card with contact and contactless operation, comprising the steps:

producing a hybrid microelectronic module provided with a first chip connected to a terminal block of contacts and a second chip connected to an antenna disposed on the module;

producing a card body provided with a cavity for receiving the microelectronic module, and producing in the card body a device for concentrating and/or amplifying electromagnetic waves, disposed below the cavity of the module.

8. A manufacturing method according to claim 7, wherein the step for producing a device for concentrating and/or amplifying electromagnetic waves comprises incorporating in the card body a metal sheet disposed below the cavity of the card body.

9. A manufacturing method according to claim 7, wherein the step for producing a device for concentrating and/or amplifying electromagnetic waves comprises incorporating in the card body an antenna, the coils of which are disposed below the cavity of the card body.

* * * * *